(12) United States Patent
Huang et al.

(10) Patent No.: US 12,568,840 B2
(45) Date of Patent: Mar. 3, 2026

(54) APPARATUS AND METHOD FOR TRANSFERRING LIGHT-EMITTING DIODES

(71) Applicant: SAMSUNG ELECTRONICS CO., LTD., Suwon-si (KR)

(72) Inventors: Ivan Huang, Pleasanton, CA (US); Massimo Martinelli, San Jose, CA (US); Eric Strasilla, San Jose, CA (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 443 days.

(21) Appl. No.: 17/807,928

(22) Filed: Jun. 21, 2022

(65) Prior Publication Data

US 2022/0415698 A1     Dec. 29, 2022

Related U.S. Application Data

(60) Provisional application No. 63/214,445, filed on Jun. 24, 2021.

(51) Int. Cl.
*H01L 23/00* (2006.01)
*B25B 11/00* (2006.01)
(Continued)

(52) U.S. Cl.
CPC ............ *H01L 24/97* (2013.01); *B25B 11/005* (2013.01); *H01L 21/67126* (2013.01);
(Continued)

(58) Field of Classification Search
CPC ... H01L 24/97; H01L 23/00; H01L 21/67126; H01L 21/67; H01L 21/6838;
(Continued)

(56) References Cited

U.S. PATENT DOCUMENTS

| | | | | |
|---|---|---|---|---|
| 3,294,392 A | * | 12/1966 | Dunham | ............... B25B 11/005 269/21 |
| 3,297,505 A | * | 1/1967 | Eaton | ....................... H01G 4/08 29/25.42 |

(Continued)

FOREIGN PATENT DOCUMENTS

| | | |
|---|---|---|
| KR | 10-2021-0002188 | 1/2021 |
| TW | 201929265 A | 7/2019 |

OTHER PUBLICATIONS

IPRP—Notification Concerning Transmittal of International Preliminary Report on Patentability and Written. Opinion of the International Searching Authority for International Patent Application No. PCT/US2022/034240, mailed. Jan. 4, 2024, 6 pages.

(Continued)

*Primary Examiner* — Monica S Carter
*Assistant Examiner* — Kent N Shum
(74) *Attorney, Agent, or Firm* — Sughrue Mion, PLLC

(57) ABSTRACT

An apparatus for transferring light-emitting diodes (LEDs) includes a backing board for supporting a backplane, a sealing member formed on the backing board around a periphery of the backplane, a transparent panel formed on the sealing member such that a space is formed between the backing board and the transparent panel, and a vacuum source for drawing a vacuum on the space.

10 Claims, 13 Drawing Sheets

(51) Int. Cl.

| | |
|---|---|
| *H01L 21/67* | (2006.01) |
| *H01L 21/683* | (2006.01) |
| *H01L 25/075* | (2006.01) |
| *H10H 20/01* | (2025.01) |

(52) U.S. Cl.
CPC ...... *H01L 21/6838* (2013.01); *H01L 25/0753* (2013.01); *H01L 2224/75261* (2013.01); *H01L 2224/753* (2013.01); *H01L 2224/95091* (2013.01); *H01L 2924/12041* (2013.01); *H10H 20/01* (2025.01)

(58) Field of Classification Search
CPC . H01L 21/683; H01L 25/0753; H01L 25/075; H01L 33/0095; H01L 33/00; H01L 2224/75261; H01L 2224/753; H01L 2224/95091; H01L 2924/12041; H01L 24/27; H01L 24/30; H01L 24/33; H01L 33/62; H01L 24/00; H01L 24/75; B25B 11/005
See application file for complete search history.

(56) References Cited

U.S. PATENT DOCUMENTS

| | | | | |
|---|---|---|---|---|
| 4,822,651 | A * | 4/1989 | Newsom | B29C 43/3607 |
| | | | | 425/389 |
| 9,941,262 | B2 | 4/2018 | Thompson | |
| 2013/0082448 | A1 * | 4/2013 | Ferguson | B23Q 3/088 |
| | | | | 279/142 |
| 2013/0327811 | A1 | 12/2013 | Dang et al. | |
| 2014/0106480 | A1 * | 4/2014 | Yoo | H01L 33/50 |
| | | | | 438/15 |
| 2015/0258750 | A1 * | 9/2015 | Kang | B32B 27/308 |
| | | | | 264/261 |
| 2017/0162552 | A1 | 6/2017 | Thompson | |
| 2018/0096878 | A1 * | 4/2018 | Wu | H01L 21/67144 |
| 2018/0339413 | A1 * | 11/2018 | Halbritter | B32B 37/1018 |
| 2019/0001433 | A1 * | 1/2019 | Yamamoto | B23K 26/032 |
| 2019/0160790 | A1 * | 5/2019 | Jouanno | B32B 17/06 |
| 2019/0295992 | A1 | 9/2019 | Ahmed et al. | |
| 2019/0371647 | A1 * | 12/2019 | Ahn | H01L 21/6838 |
| 2020/0313035 | A1 | 10/2020 | Lee et al. | |
| 2020/0335659 | A1 | 10/2020 | Park et al. | |
| 2020/0395503 | A1 * | 12/2020 | Wu | H01L 33/0095 |
| 2021/0184072 | A1 | 6/2021 | Gallagher et al. | |
| 2022/0216364 | A1 * | 7/2022 | Albert | H10H 20/018 |
| 2022/0332633 | A1 * | 10/2022 | Burrows | C03C 17/007 |

OTHER PUBLICATIONS

Notification of Transmittal of the International Search Report and Written Opinion of the International Search Authority for International Patent Application No. PCT/US2022/034240, mailed Oct. 21, 2022, 9 pages.
Communication dated Apr. 1, 2025, issued by the European Patent Office in counterpart European Application No. 22829105.0.
Taiwanese Office Action issued in Taiwanese Patent Application No. 111123039 on Dec. 24, 2025.

\* cited by examiner

APPARATUS AND METHOD FOR TRANSFERRING LIGHT-EMITTING DIODES

RELATED APPLICATION

This present application claims the benefit of priority from U.S. Provisional Patent Application Ser. No. 63/214,445, filed on Jun. 24, 2021 and the entire content of which is incorporated herein by reference.

FIELD

The embodiments of the invention are directed generally to an apparatus for transferring light-emitting diodes (LEDs), and a method of transferring LEDs that includes drawing a vacuum on a space such that a transparent panel presses a plurality of LED coupons toward a backplane.

BACKGROUND

Light emitting diodes (LEDs) are used in electronic displays, such as liquid crystal displays in laptops or LED televisions. However, it is challenging to attach LEDs to a backplane (e.g., display backplane) with a high yield.

SUMMARY

According to an aspect of the present disclosure, an apparatus for transferring light-emitting diodes (LEDs) includes a backing board configured to support a backplane, a sealing member located on the backing board around a periphery of a position of the backplane, a transparent panel located on the sealing member such that a space is formed between the backing board and the transparent panel, a vacuum source configured to draw a vacuum on the space, and a laser radiation source that is configured to direct a laser radiation through the transparent panel to irradiate a LED coupon on the backplane in the space.

According to yet another aspect of the present disclosure, a method of transferring light-emitting diodes (LEDs) includes placing a backplane on a backing board, wherein a sealing member is located around a periphery of the backplane, placing a plurality of first LED coupons on the backplane, placing a transparent panel on the sealing member and over the plurality of first LED coupons, such that a space is formed between the backing board and the transparent panel, drawing a vacuum on the space such that the transparent panel presses the plurality of first LED coupons toward the backplane, and directing laser radiation through the transparent panel to irradiate the plurality of first LED coupons located on the backplane.

DETAILED DESCRIPTION

Figure 1:
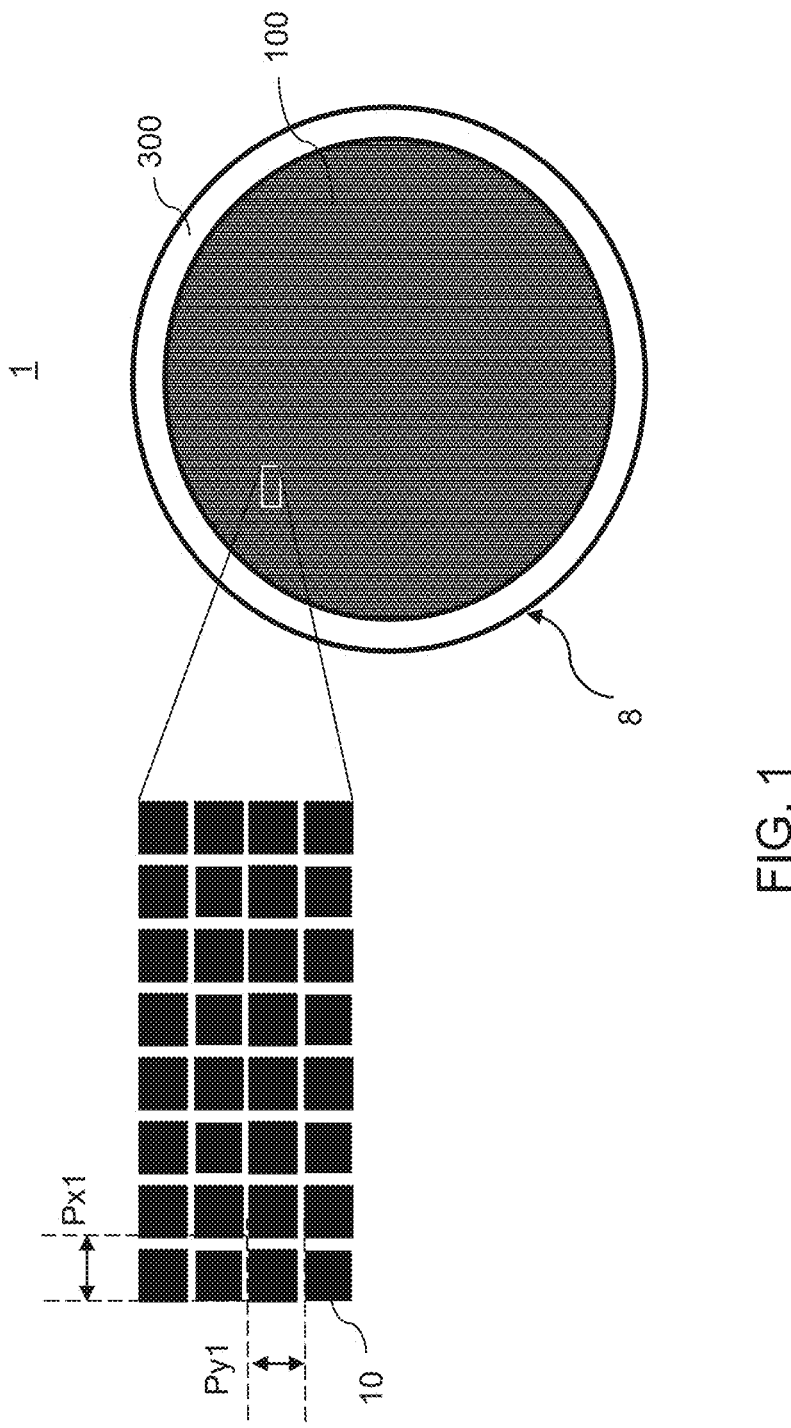
FIG. 1 illustrates a top view of LED coupon (e.g., first source coupon) 1 containing a growth substrate 8 including dies of LEDs 10, according to some embodiments.

The embodiments of the present disclosure are directed to an apparatus and method for transferring LEDs, the various aspects of which are described below. Throughout the drawings, like elements are described by the same reference numeral. Elements with the same reference numeral are presumed to have a same material composition unless expressly stated otherwise. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

An LED may be a vertical structure (e.g., a vertical LED) in which the p-side and n-side contacts are located on opposite sides of the structure or a lateral structure in which the p-side and n-side contacts are located on the same side of the structure. In the embodiments of the present disclosure, a method is provided for transferring LEDs (e.g., an array of LEDs) from a growth substrate to a target substrate, such as a backplane. In an illustrative example, the target substrate can be a backplane such as an active or passive matrix backplane substrate for driving LEDs. As used herein, a "backplane" refers to any substrate configured to affix multiple LEDs thereupon.

The LEDs may include different "types" such as red LEDs which emit red light, green LEDs which emit green light and blue LEDs which emit blue light. LEDs of the same type may be fabricated on respective growth substrates (e.g., initial growth substrates). In particular, LEDs may be fabricated as an array on growth substrates that are processed to form various electronic devices thereupon or therein, including LEDs, sensor devices (e.g., photodetectors), etc. The LEDs may be for example, vertical LEDs, lateral LEDs, or any combination thereof.

Referring to FIG. 1, an LED coupon (e.g., first source coupon) 1 containing a growth substrate 8 including dies of LEDs 10 is illustrated. The growth substrate 8 may include an edge exclusion region 300 at a periphery, in which LEDs 10 are not formed. The growth substrate 8 can include LEDs of a same type (e.g., red LEDs, green LEDs, blue LEDs, etc.) arranged in a first array 100. That is, the LEDs 10 may include multiple instances of the same type LED, which may be, for example, light emitting diodes that emit light at a same peak wavelength.

The first array 100 has a primary-direction pitch Px1 along a respective primary direction (i.e., the primary direction of the first array 100) and has a secondary-direction pitch Py1 along a respective secondary direction (i.e., the secondary direction of the first array 100). As used herein, a primary direction and a second direction of an array refer to two directions along which a unit cell of the array is repeated. In a rectangular array, the primary direction and the second direction may be perpendicular to each other, and are referred to as an x-direction and a y-direction.

The LEDs 10 on the growth substrate 8 can be transferred to one or more backplanes having bonding sites configured in a second array. A predetermined transfer pattern and a predetermined transfer sequence can be employed for transfer of the LEDs 10. LEDs of different types (e.g., green LEDs and blue LEDs) transferred from different growth substrates can be employed in conjunction with the LEDs 10 (e.g., red LEDs) to provide a functional direct view LED assembly.

Figure 2:
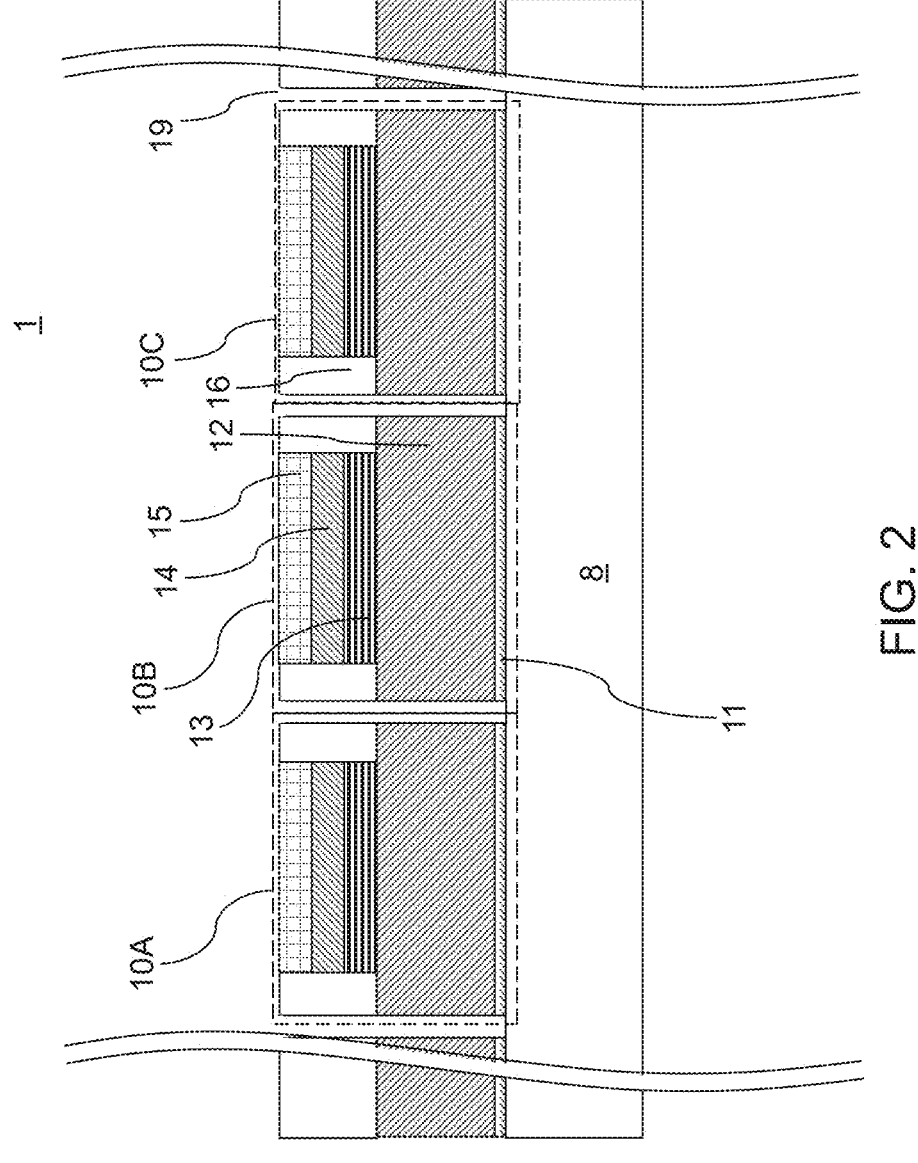
FIG. 2 illustrates a side cross-sectional view of the LED coupon 1, according to some embodiments.

FIG. 2 illustrates a cross-sectional view of the LED coupon 1, according to some embodiments. As illustrated in FIG. 2, the LED coupon 1 includes the growth substrate 8 and a plurality of LEDs 10A, 10B, 10C located on the growth substrate 8. The growth substrate 8 may be any suitable substrate on which LED layers may be grown, such as a single crystalline substrate on which LED semiconductor layers can be grown. For example, the growth substrate 8 may include a sapphire substrate.

The LEDs 10A, 10B, 10C may include a buffer layer 11 and a first conductivity type semiconductor layer 12. The buffer layer 11 may include an amorphous III-V compound semiconductor layer that includes gallium and nitrogen. The first conductivity type semiconductor layer 12 may include a crystalline III-V compound semiconductor material layer that includes gallium and nitrogen. For example, the buffer layer 11 may include amorphous gallium nitride (GaN), indium gallium nitride (InGaN), aluminum gallium nitride (AlGaN) or aluminum indium gallium nitride (AlInGaN), while the first conductivity type semiconductor layer 12 may include single crystalline or polycrystalline GaN, InGaN, AlGaN or AlInGaN. The first conductivity type semiconductor layer 12 may have conductivity of the first type, which may be n-type or p-type. For example, the first conductivity type semiconductor layer 12 may include an n-type semiconductor layer. The buffer layer 11 may be undoped or may also have the first conductivity type.

The buffer layer 11 is located between the first conductivity type semiconductor layer 12 and the growth substrate 8. The buffer layer 11 may have the same material composition as the first conductivity type semiconductor layer 12.

For example, in one embodiment, the buffer layer 11 and the first conductivity type semiconductor layer 12 may both comprise gallium nitride. In this case, the buffer layer 11 may be formed during the initial deposition of crystalline gallium nitride first conductivity type semiconductor layer 12 on growth substrate 8 which may be a patterned sapphire substrate (PSS) in this embodiment. That is, the buffer layer 11 may be formed as the gallium nitride growth conditions transition from the amorphous to crystalline gallium nitride layer growth. The thickness of the buffer layer 11 can be in a range from 100 nm to 400 nm, such as from 150 nm to 300 nm, although lesser and greater thicknesses can also be employed. The thickness of the first conductivity type semiconductor layer 12 can be from 500 nm to 5 microns, such as 1 to 3 microns, although lesser and greater thicknesses can also be employed.

An active layer 13 may be formed over the first conductivity type semiconductor layer 12. In one embodiment, the active layer 13 may comprise at least one bulk, quasi-bulk or quantum well layer selected from GaN, InGaN, AlGaN and/or AlInGaN. For example, the active layer 13 may comprise a stack of one or more InGaN quantum well layers between respective GaN and/or AlGaN barrier layers. Generally, any light emitting layer stack known in the art can be employed for the active layer 13.

A second conductivity type semiconductor layer 14 may be formed over the active layer 13. The second conductivity type semiconductor layer 14 may have a doping of a second conductivity type. The second conductivity type is the opposite of the first conductivity type. If the first conductivity type is n-type, then the second conductivity type is p-type, and vice versa. In one embodiment, the first conductivity type is n-type, and the second conductivity type is p-type. Each second conductivity type semiconductor layer 14 may comprise a crystalline (e.g., single crystalline or polycrystalline) GaN, InGaN, AlGaN and/or AlInGaN layer. Thus, the active layer 13 is located between the first conductivity type semiconductor layer 12, and the second conductivity type semiconductor layer 14.

A contact-level material layer 15 may be formed over the second conductivity type semiconductor layer 14. The contact-level material layer 15 may include at least one electrically conductive layer which functions as an electrode (e.g., p-type side electrode). The contact-level material layer 15 may include a layer stack including, from bottom to top, a transparent conductive oxide layer, a reflector layer and/or a bonding pad material layer. The transparent conductive oxide layer may include a transparent conductive oxide material such as indium tin oxide or aluminum doped zinc oxide. The reflector layer may include gold, silver and/or aluminum. The bonding pad material layer may include a metallic material that can function as a bonding pad, such as gold, copper, nickel, titanium, titanium nitride, tungsten, tungsten nitride, another metal having a higher melting point than a solder material to be subsequently employed, alloys thereof, and/or layer stacks thereof.

The stack of second conductivity type semiconductor layer 14, active layer 13, and optionally the first conductivity type semiconductor layer 12 within each LED 10A, 10B, 10C may be patterned employing various patterning methods to form grooves 19 between adjacent LEDs 10A, 10B, 10C. A dielectric matrix layer 16 can be formed between the first LEDs 10A, 10B, 10C. The grooves 19 define the area of each LED 10A, 10B, 10C. Specifically, each continuous set of patterned material layers overlying the growth substrate 8 and laterally enclosed by a set of grooves 19 may constitute the LED 10A, 10B, 10C. In one embodiment, the grooves 19 can be formed in a lattice pattern to provide an array of LEDs, which may be a periodic array of the LEDs. The LEDs 10A, 10B, 10C can emit light at a first peak wavelength, such as a blue light having the first peak wavelength in the blue spectral range.

While FIG. 2 illustrates a specific embodiment of an LED coupon 1 including LEDs 10A, 10B, 10C, embodiments of the present disclosure can be utilized employing any configuration for LEDs 10A, 10B, 10C provided that a structure for attaching a bonding material portion may be provided on a side of the LED 10A, 10B, 10C that faces away from the growth substrate 8.

Figure 3:
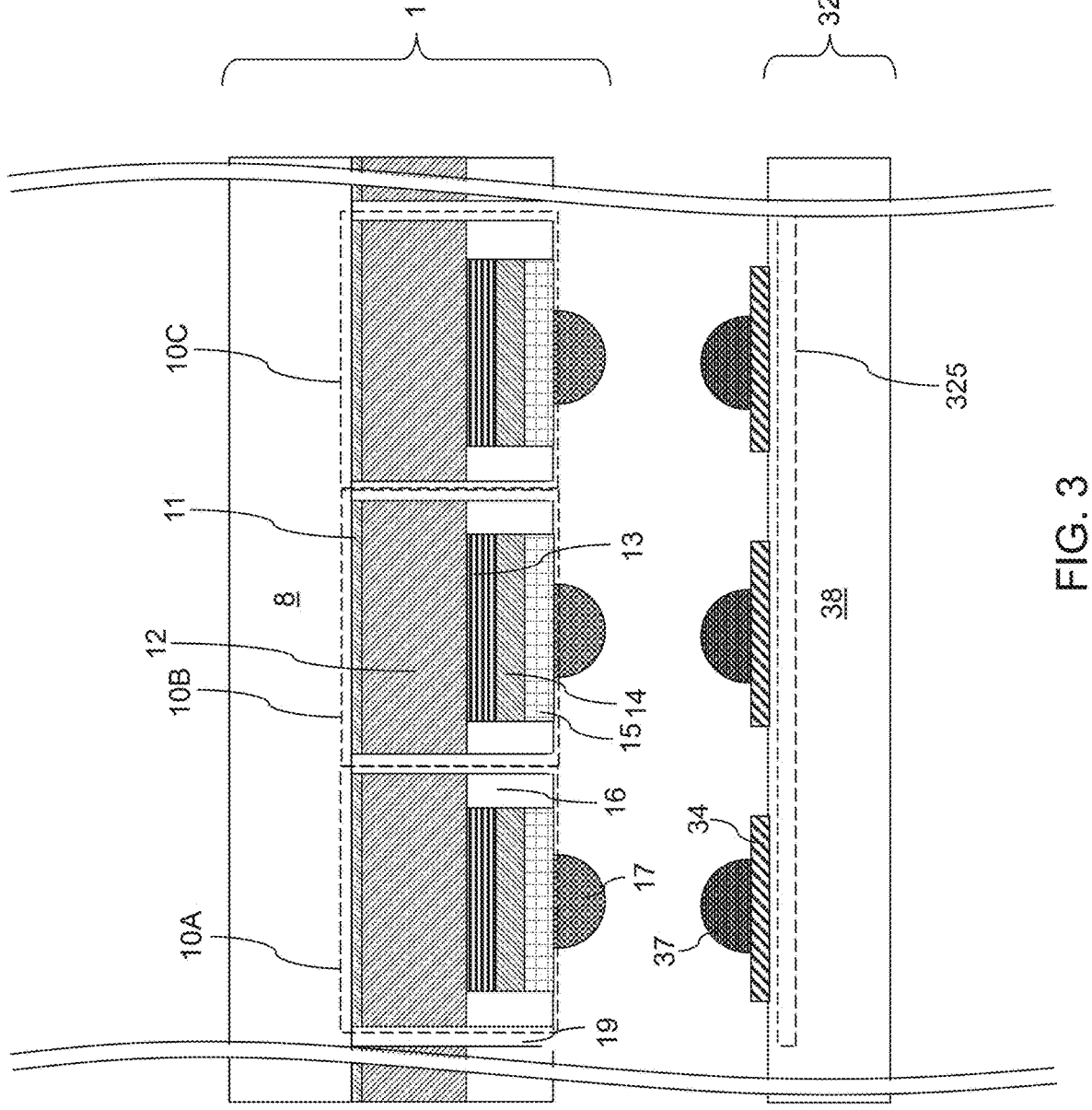
FIG. 3 illustrates a side cross-sectional view of an arrangement of the LED coupon 1 in preparation of transferring the LEDs 10 A, 10B, 10C from the LED coupon 1 to a backplane 32, according to some embodiments.

FIG. 3 illustrates an arrangement of the LED coupon 1 in preparation of transferring the LEDs 10A, 10B, 10C from the LED coupon 1 to a backplane 32, according to some embodiments. As illustrated in FIG. 3, a diode-side bonding material portion 17 may be formed on the contact-level material layer 15 in each of the LEDs 10A, 10B, 10C. In one embodiment, the diode-side bonding material portions 17 can be solder material portions such as pure tin or an alloy of tin and indium.

The backplane 32 may be a single large panel version of substrate 38 or several substrates 38 arranged to fit in the space of a large panel, and a metal interconnect layer 325 formed on a front side surface of the substrate 38. In one embodiment, the substrate 38 can include a plastic (e.g., polymer) substrate, a glass substrate or a silicon substrate. The backplane 32 may also have a large size (e.g., Gen 8 or greater). In one embodiment, the metal interconnect layer 325 can include a plurality of metal interconnect structures located on the surface of the substrate 38 and/or embedded in at least one insulating material and providing electrical connections between the LEDs to be bonded onto the backplane 32 and input/output pins of the backplane 32.

Bonding pads 34 may be formed on a surface of the backplane 32 (e.g., a surface of substrate 38) that overlies the metal interconnect layer 325. In one embodiment, the bonding pads 34 can be arranged as a two-dimensional periodic array or as a one-dimensional periodic array. The bonding pads 34 may include a bonding pad material such as gold, copper, nickel, titanium, titanium nitride, tungsten, tungsten nitride, another metal having a higher melting point than a solder material to be subsequently employed, alloys thereof, and/or layer stacks thereof.

A backplane-side bonding material portion 37 may be formed on the bonding pads 34. In one embodiment, the backplane-side bonding material portions 37 can be solder material portions such as pure tin or alloy of tin and indium. The LED coupon 1 and the backplane 32 may be aligned such that a pair of a diode-side bonding material portion 17 and a backplane-side bonding material portion 37 face each other at every lattice point of the periodic array of the bonding pads 34.

Figure 4A:
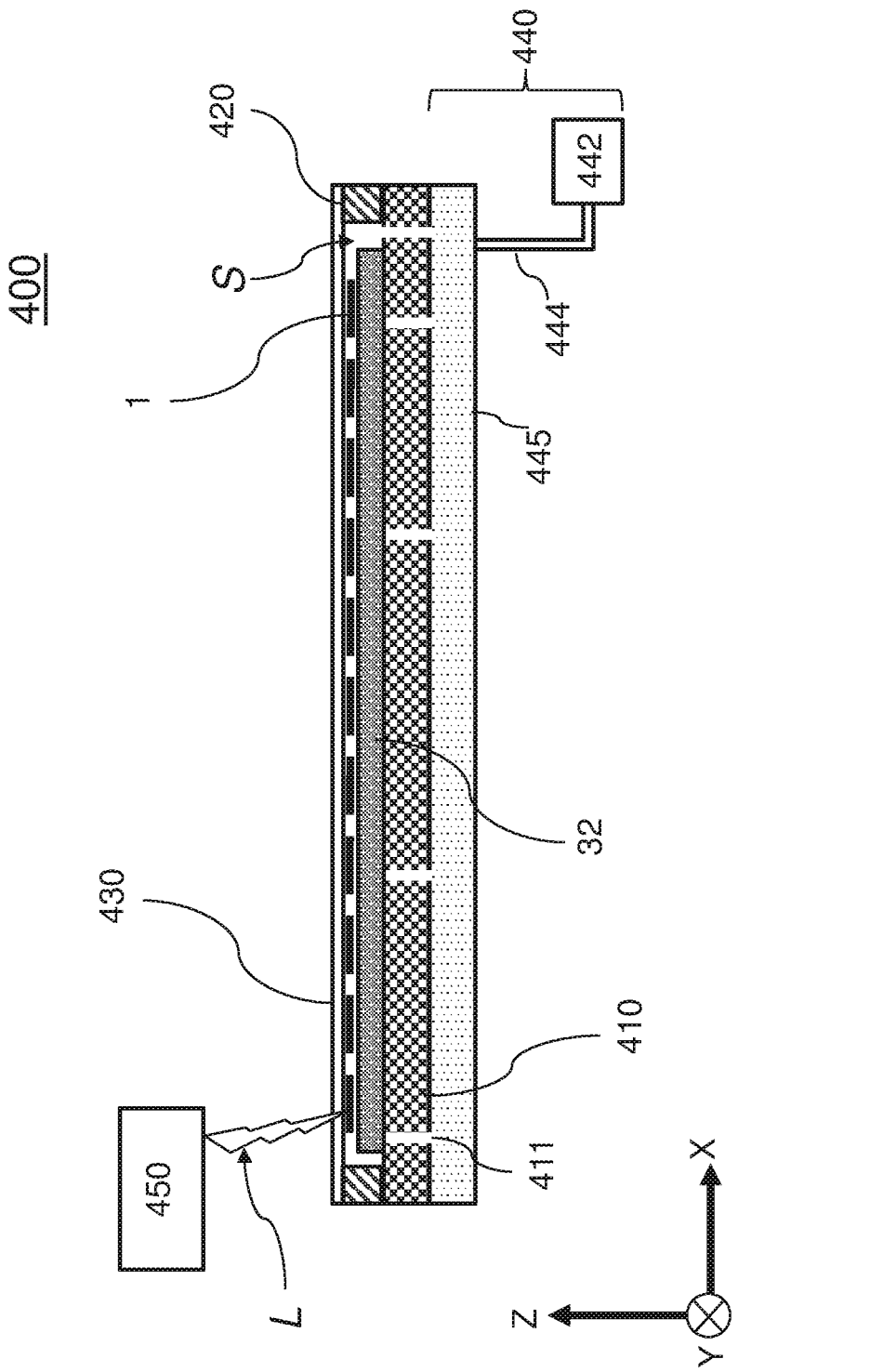
FIG. 4A illustrates a side cross-sectional view of an apparatus 400 that may be used to transfer the LEDs 10A, 10B, 10C from the LED coupon 1 to the backplane 32, according to some embodiments.

FIG. 4A illustrates an apparatus 400 that may be used to transfer the LEDs 10A, 10B, 10C from the LED coupons 1 to the backplane 32, according to some embodiments. Hereinafter, the method may be described specifically with respect to LED 10A, however, the LEDs 10B and 10C may be sequentially transferred to the same backplane 32 according to the same method.

The apparatus 400 may include a backing board 410 for supporting a backplane 32, a sealing member 420 formed on the backing board 410 around a periphery of the backplane 32, a transparent panel 430 placed on the sealing member 420 such that a space S is formed between the backing board 410 and the transparent panel 430, and a vacuum source 440 for drawing a vacuum on the space S.

The apparatus 400 may also include a laser radiation source (i.e., a laser) 450 that directs a laser radiation L through the transparent panel 430 to irradiate the LED coupon 1 formed on the backplane 32 in the space S. In one embodiment, the laser radiation source 450 may emit laser radiation L that irradiates buffer layer 11 of the LED 10A to perform a partial laser lift off process of the LED 10A.

A process of transferring LEDs to the backplane 32 may be performed, for example, at room temperature, and may begin by placing the backplane 32 on a backing board 410 (e.g., non-compliant, rigid backing board) that is in a vacuum laminator 445, and then placing a plurality of LED coupons 1 on the backplane 32. The LED coupons 1 may include, for example, micro-LED coupons that each include a substrate (e.g., growth substrate) and a plurality of micro-LEDs that are formed on the substrate and are to be transferred from the substrate to the backplane 32. The micro-LEDs may have a size, for example, that is much less than about 100 microns, and may be as small as 1 to 20 microns, for example 2 to 10 microns. However, larger LEDs or monolithic arrays of LEDs may also be transferred.

The plurality of LED coupons 1 may be arranged on the backplane 32 in an array so that a diode-side bonding material portion 17 formed on the LEDs 10A, 10B, 10C is aligned with a backplane-side bonding material portion 37 on the bonding pads 34 that are arranged in an array on the backplane 32 as shown for example in FIG. 3. In particular, the LED coupons 1 may be "tiled" on the backplane 32 so as to cover substantially the entire backplane 32. The alignment of the LED coupons 1 may be performed, for example, by an optical sensor (not shown) which determines a precise location of the LED coupon 1 and robotic arm (not shown) which positions the LED coupon 1 into the precise location.

The transparent panel 430 may then be placed over the plurality of LED coupons 1 and over the sealing member 420 such that a space S is formed between the backing board 410 and the transparent panel 430. The vacuum source 440 may then draw a vacuum on the space S, and the vacuum drawn on the space may pull the transparent panel 430 toward the backplane 32 causing the transparent panel 430 to press the LED coupon 1 toward the backplane 32. In particular, a pressure with which the transparent panel presses on the plurality of LED coupons may be substantially uniform over the plurality of LED coupons.

In some embodiments the backing board 410 may include a rigid backing board that is made, for example, of metal or rigid polymer material. The backing board 410 may include a vacuum laminator backing board and may include one or more slits 411 (e.g., through holes, channels, etc.) for allowing the vacuum source 440 to access the space S and allow the vacuum source 440 to draw a vacuum in the space S through the slits 411. Alternatively, the vacuum may be drawn through or adjacent to the lateral sides of the backing board 410 in addition to or instead of through the slits 411. The backing board 410 must also have a size (e.g., area) great enough to accommodate a backplane 32 of a large size (e.g., Gen 8 or greater), and to accommodate the sealing member 420 that may be formed around a periphery of the backplane 32.

The sealing member 420 may be a perimeter shim frame that may eliminate edge-effects and provide a good seal with the transparent panel 430. In some embodiments, the sealing member 420 may include an O-ring type or gasket type of sealing member that may be configured in a rectangular shape that approximates a shape of the backplane 32. The sealing member 420 may be formed continuously around the periphery of the backplane 32 so that a gap (e.g., in the X-direction of FIG. 4A) between the sealing member 420 and the periphery of the backplane 32 is no more than about two centimeters. The sealing member 420 may be formed, for example, of a polymer material, such as polyurethane, silicone, neoprene, nitrile rubber, fluorocarbon, polytet-rafluoroethylene (PTFE), or ethylene propylene diene mono-mer (EPDM) rubber. A thickness (e.g., in the Z-direction of FIG. 4A) of the sealing member 420 should be substantially the same as a sum of thicknesses of the backplane 32 and the LED coupon 1. If the thickness of the sealing member 420 is too small, then the transparent panel 430 may rest on the LED coupons 1 and not contact the sealing member 420 so that no seal can be formed around the space S. However, if the thickness of the sealing member 430 is too great, then the distance between the transparent panel 430 and backplane 32 may be too great to allow the transparent panel 430 to push the LED coupons 1 toward the backplane 32 under vacuum. Thus, where a sum of thicknesses of the backplane and LED coupon is given as $T_b$, a thickness $T_s$ of the sealing member 420 may be in a range from $0.9T_b \leq T_s \leq 1.1T_b$.

The transparent panel 430 may be a compliant (e.g., pliable or bendable) transparent panel which may be large enough (e.g., have an area large enough) to cover the sealing member 420 around the entire periphery of the backplane 32. In other words, the transparent panel 430 may have lower stiffness (i.e., lower rigidity and a lower Young's modulus) than the backing board 410. The transparent panel 430 may also be sufficiently transparent so as not to interfere with the laser radiation L that is being directed through the transparent panel 430 at the LED coupons 1 in the space S. In one embodiment the transparent panel 430 may have a thickness of not greater than a few millimeters (e.g., less than about 5 millimeters, such as 0.1 to 2 mm, for example 0.5 to 1 mm). If the thickness is too great, then the focal point of the laser radiation from the source 450 may be too far from the work surface on the LED coupons 1 during the subsequent laser irradiation steps. The transparent panel 430 may be formed of glass, such as borosilicate glass, although other glass may be used, as long as they are transparent to the laser radiation emitted by the laser radiation source 450.

The vacuum source 440 may include the vacuum lami-nator 445, a vacuum pump 442 for drawing the vacuum, and piping 444 that connects the vacuum pump 442 to one or more vacuum ports on the vacuum laminator 445. The vacuum pump 442 may be capable of drawing a sufficient vacuum in the space S, so that a pressure with which the transparent panel 430 presses the LED coupon 1 can be easily and very accurately controlled to any pressure ranging all the way up to atmospheric pressure, 14.7 psi, and is applied substantially uniformly over an entirety of the transparent panel 430.

The laser radiation source 450 may include one or more types of lasers for generating laser radiation L at different wavelengths and powers. The laser radiation source 450 may be configured to perform in situ laser lift-off (LLO) and laser scanning (LS) raster (e.g., in the Y-direction of FIG. 4A) while the backing board 410 is indexed in the perpendicular direction (e.g., in the X-direction of FIG. 4A). In particular, the laser radiation source 450 may generate a detachment laser beam LD for detaching the LED 10 from the LED coupon 1 in a partial laser lift-off process. The detachment laser beam LD may have an ultraviolet wavelength or a wavelength in a visible light range. In some embodiments, the laser radiation source 450 may include an excimer (UV) laser with a wavelength of 248 nm or 193 nm for generating the detachment laser beam LD. The laser radiation source 450 may also generate a laser beam LB (e.g., infrared laser beam) during a bonding laser irradiation process. In some embodiments, the laser radiation source 450 may include a $CO_2$ laser for generating laser beam LB (e.g., infrared laser beam) having a wavelength of 9.4 microns or 10.6 microns. Thus, the laser radiation source 450 may include two or more different lasers.

Figure 4B:
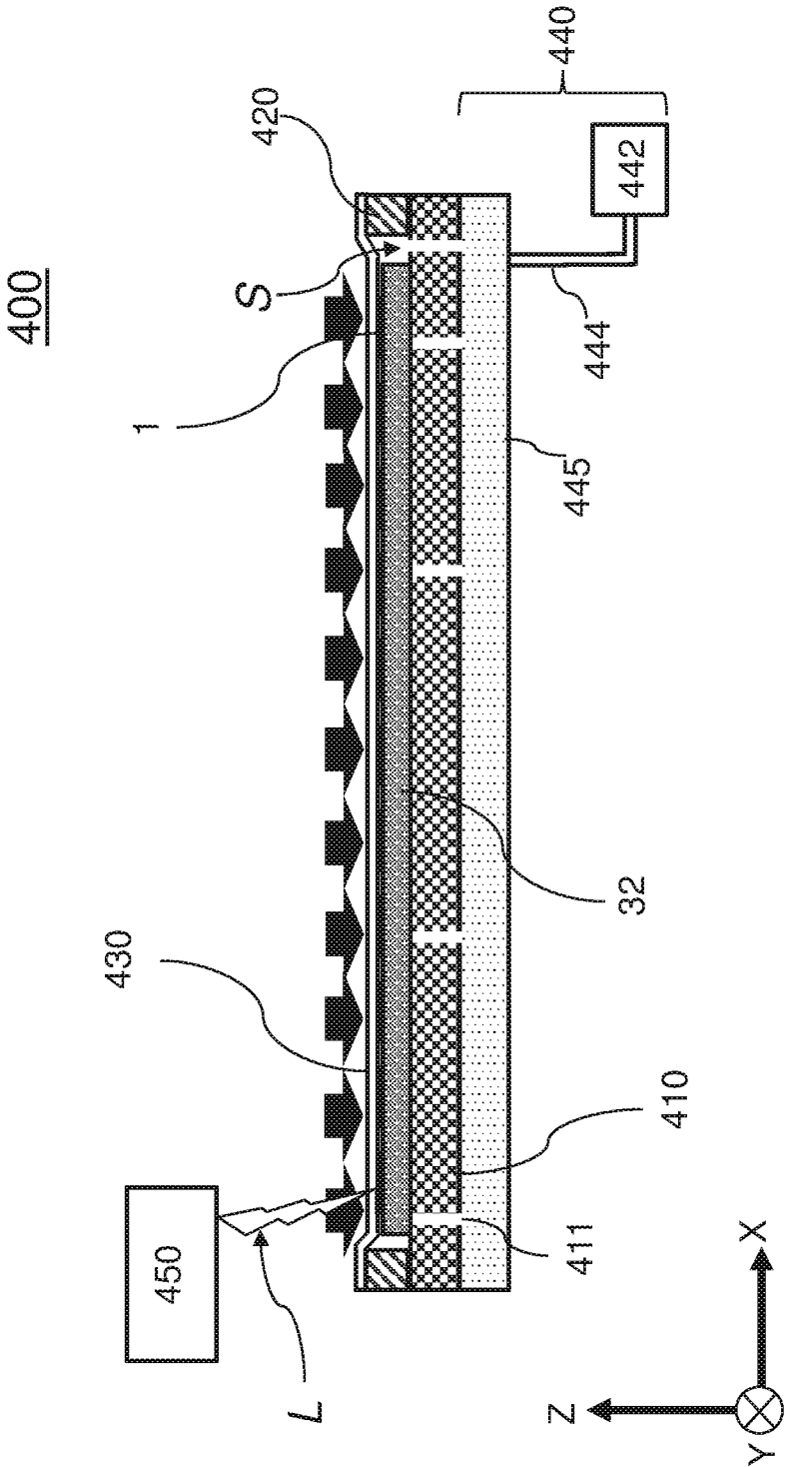
FIG. 4B illustrates a side cross-sectional view of the apparatus 400 after the pulling of a vacuum on the space S by the vacuum source 440, according to some embodiments.

FIG. 4B illustrates a side view of the apparatus 400 after the pulling of a vacuum on the space S by the vacuum source 440, according to some embodiments. As illustrated in FIG. 4B, the transparent panel 430 may be pliable so that it flexes downward (e.g., in the Z-direction in FIG. 4B) under the vacuum drawn by the vacuum source 440 in space S that is sealed by the sealing member 420. The amount of downward pressure applied by the transparent panel 430 on the LED coupon 1 may be regulated by regulating the amount of vacuum drawn by the vacuum source 440, and therefore, may be regulated by an amount of current supplied to the vacuum pump 442. That is, the downward pressure may be increased by increasing a vacuum drawn by the vacuum source 440, and may be decreased by decreasing a vacuum drawn by the vacuum source 440. In some embodiments, a downward pressure applied by the transparent panel 430 on the LED coupon 1 may be 10 to 15 psi, and may be applied substantially uniformly over an entirety of the transparent panel 430.

Figure 5:
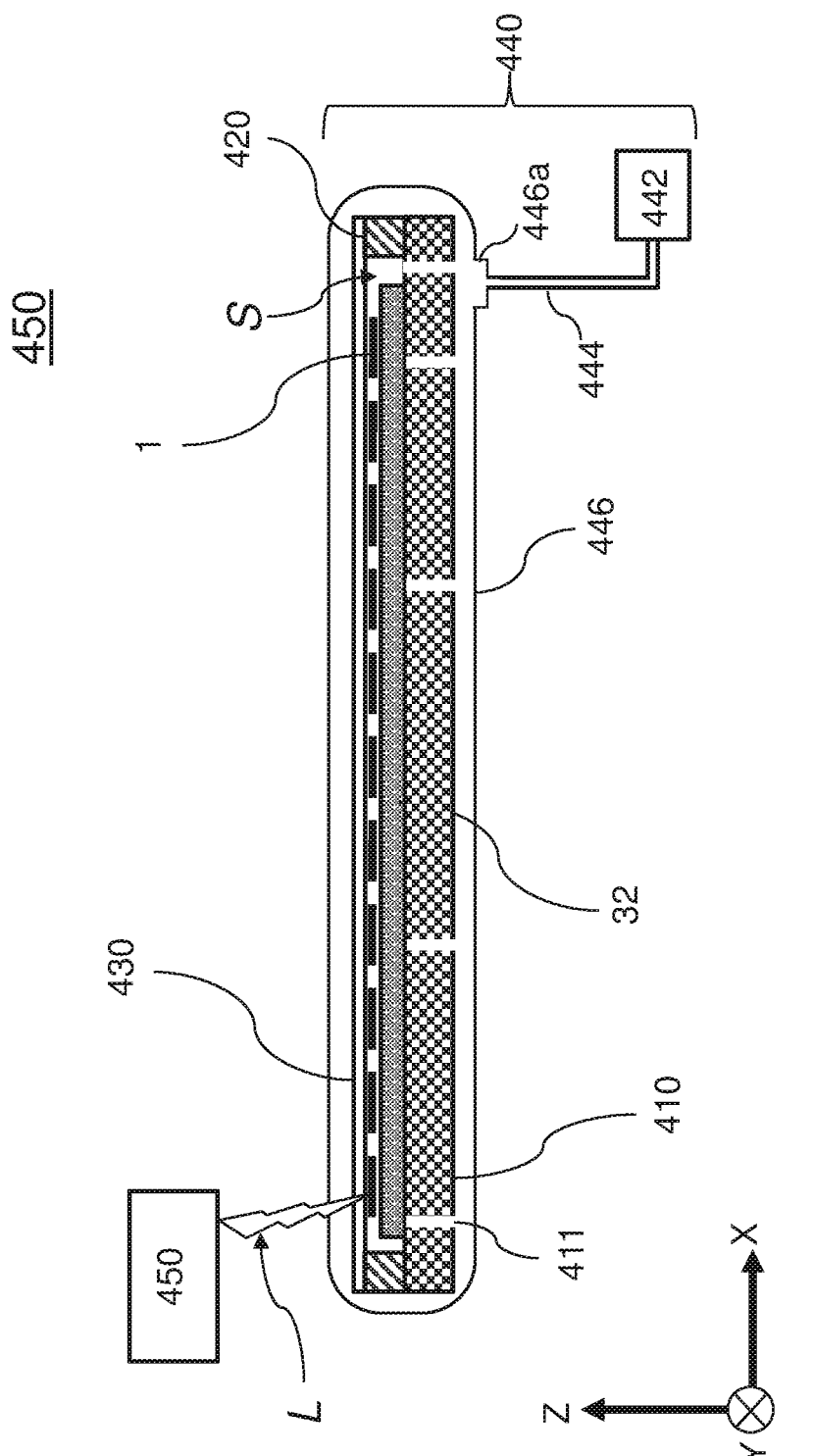
FIG. 5 illustrates a side a cross-sectional view of an apparatus 450 for transferring LEDs according to some embodiments.

FIG. 5 illustrates a side view of an apparatus 450 for transferring LEDs according to some embodiments. As illustrated in FIG. 5, the apparatus 450 may include the features of apparatus 400 in FIGS. 4A-4B, except that the vacuum source 440 may be different. In the apparatus 450, the vacuum source 440 may include a vacuum bag 446 that may be formed over the backing board 410, sealing member 420 and transparent panel 430. The vacuum bag 446 may be made of plastic or another material that is transparent to and unaffected by the laser radiation L emitted from the laser radiation source 450. The vacuum bag 446 may also include one or more ports 446a to which the vacuum piping 444 may be connected. In operation, the vacuum source 440 may draw a vacuum on the space S by drawing a vacuum on the vacuum bag 446 with substantially the same result as provided by apparatus 400 that is illustrated in FIG. 4B. That is, the vacuum causes a downward pressure to be applied by the transparent panel 430 on the LED coupon 1, and that downward pressure may be 10 to 15 psi, and applied substantially uniformly over an entirety of the transparent panel 430.

In some embodiments, the apparatus 400 and the appa-ratus 450 may provide a uniform clamping pressure over very large area panels, such as Gen 8 size and above (e.g., 20 inches diagonal or larger), for the purpose of micro-LED mass transfer, and may work equally well with multi-transfer coupon design (e.g., different color LED coupons). In particular, the apparatus 400 and the apparatus 450 may reduce the height distribution difference and shifting the neutral stress point upward, such that gap and stress distri-butions remain in an acceptable range across an entire micro-LED array, and from one process step to the next process step. Therefore, the inherent micron size range waviness in the backplane and/or the LED coupons (e.g., due to surface roughness or warpage) may be reduced or eliminated by the uniform pressure applied by the apparatus across the entire backplane area. This improves the bonding quality and accuracy and improves display device yield because non-uniform coupon height with respect to the backplane hinders mass LED transfer and decreases display device yield.

In apparatus 400, a method of transferring LEDs may begin with placing the backplane 32 (e.g., display backplane) on a backing board 410 (e.g., rigid backing board) in a vacuum laminator 445, whereas in apparatus 450, the method may begin with placing the backplane 32 (e.g., display backplane) on a backing board 410 (e.g., rigid backing board) in a vacuum bag 446. The LED coupons may be placed (e.g., tiled) on the backplane 32 (e.g., display panel, TV panel, etc.) until they cover the entire backplane 32. The sealing member 420 (e.g., shim frame) may be placed around the perimeter of the backplane 32 to eliminate edge-effects and provide a good seal. The transparent panel 430 (e.g., cover glass) may then be placed on top of the LED coupons 1 so as to form the space S that is sealed by the sealing member 420. The vacuum source 440 may then be used to draw a vacuum in the space S until a desired level of vacuum (e.g., pressure) is reached. These process steps may be repeated for LED coupons 1 containing different color LEDs.

Figure 6A:
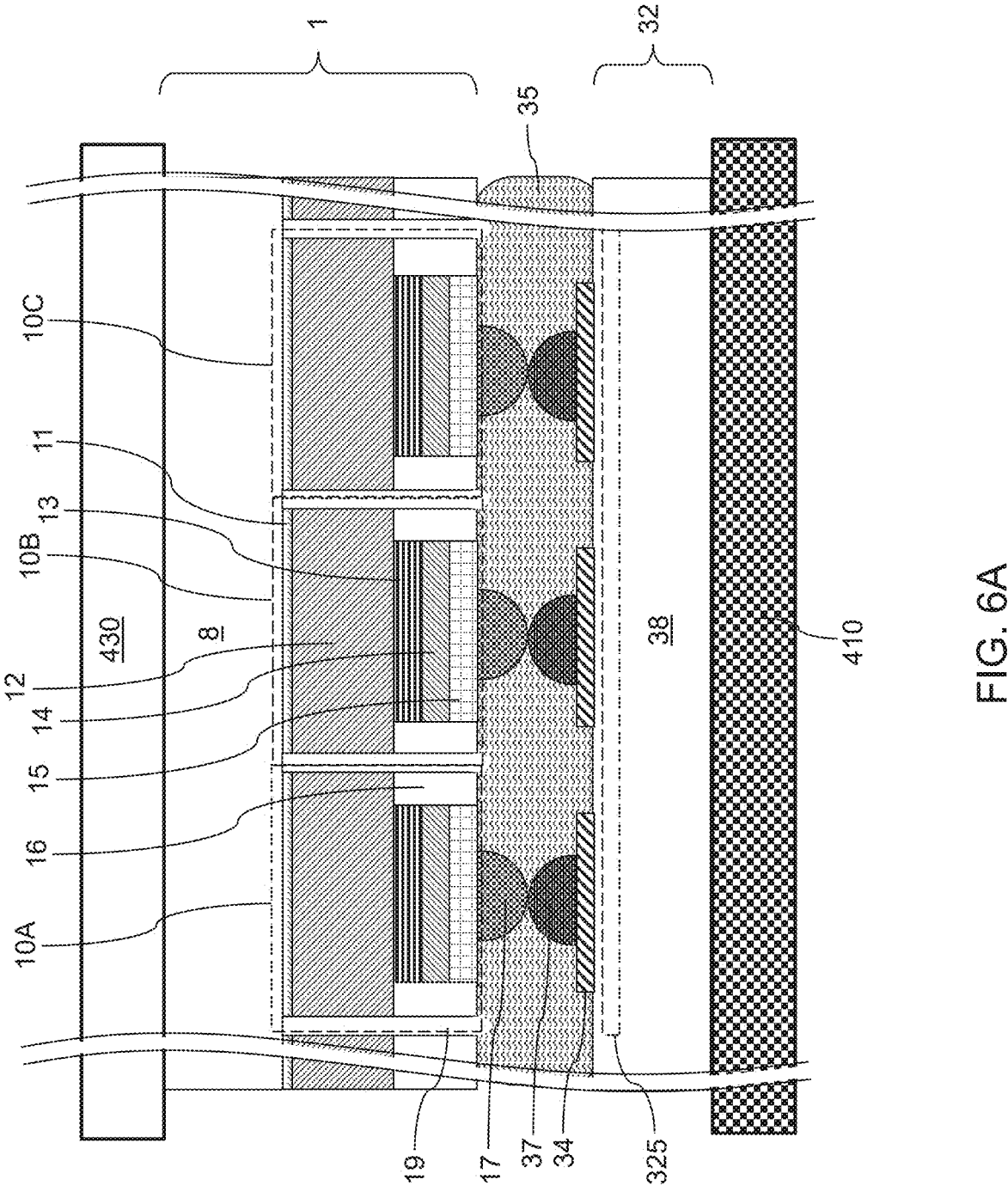
FIG. 6A illustrates a side a cross-sectional view of the backplane 32 placed on a backing board 410, the LED coupon 1 placed on the backplane 32, and the transparent panel 430 placed on the LED coupon 1, according to some embodiments.

Referring again to the drawings, FIGS. 6A-6F illustrate a method of transferring the LED 10A from LED coupon 1 to the backplane 32, according to some embodiments. As noted above, the same method may also be used to transfer LEDs 10B and 10C to the backplane 32. The method may be implemented by using either apparatus 400 or apparatus 450 that are described above. As illustrated in FIG. 6A, the backplane 32 may be placed on a backing board 410, the LED coupon 1 may be placed on the backplane 32, and the transparent panel 430 may be placed on the LED coupon 1, according to some embodiments. The LEDs 10A, 10B, 10C of LED coupon 1 may be brought into contact with the backplane 32 such that each facing pair of a diode-side bonding material portion 17 and a backplane-side bonding material portion 37 contact each other. Each of the diode-side bonding material portion 17 can have an areal overlap with a respective underlying backplane-side bonding material portion 37. In one embodiment, the area of the overlap may be at least 70%, such as more than 80% and/or more than 90%, of the area of the diode-side bonding material portion 17. In one embodiment, the geometrical center of each diode-side bonding material portion 17 can overlie a geometrical center of an underlying backplane-side bonding material portion 37.

Generally, at least one bonding material portion (17, 37) can be disposed between each vertically neighboring pair of a respective one of the bonding pads 34 and a respective one of the LEDs 10A, 10B, 10C. In one embodiment, a pair of a diode-side bonding material portion 17 and a backplane-side bonding material portion 37 can be provided between each vertically neighboring pair of a respective one of the bonding pads 34 and a respective one of the LEDs 10A, 10B, 10C. In one embodiment, the diode-side bonding material portions 17 may be omitted. In another embodiment, the backplane-side bonding material portions 37 may be omitted.

In one embodiment, a solder flux 35 may be applied between the backplane 32 and the LEDs 10A, 10B, 10C such that the solder flux 35 laterally surrounds each bonding material portion (17, 37). The solder flux 35 may be any suitable liquid flux which reacts with tin oxide to leave metallic tin bonding material portions (17, 37).

With the LED coupon 1 formed on the backplane 32 as in FIG. 6A, the vacuum source 440 may be engaged to cause the transparent panel 430 to apply a first pressure (e.g., first amount of downward pressure (e.g., downward force)) to the LED coupon 1 so as to hold the LED coupon 1 in place on the backplane 32 without lateral slippage. In particular, the backplane 32 and the LED coupon 1 can be held in place while a downward force is applied by the transparent panel 430 to the LED coupon 1, the bonding material portions (17, 37) and the backplane 32 along the vertical direction. The magnitude of the downward force can be selected such that the bonding material portions (17, 37) are not deformed in a significant manner, i.e., the bonding material portions (17, 37) maintain the shapes as provided prior to clamping, and without bonding the respective bonding material portions 17 and 37 to each other. In an illustrative example, if 2,000,000 pairs of a diode-side bonding material portion 17 and a backplane-side bonding material portion 37 are present between a 4 square meter sized backplane 32 and the tiled LED coupons 1, then the magnitude of the downward force applied by the transparent panel 430 may be in a range from 250 N to 400 N or about 0.1 mN to 0.2 mN per LED.

Figure 6B:
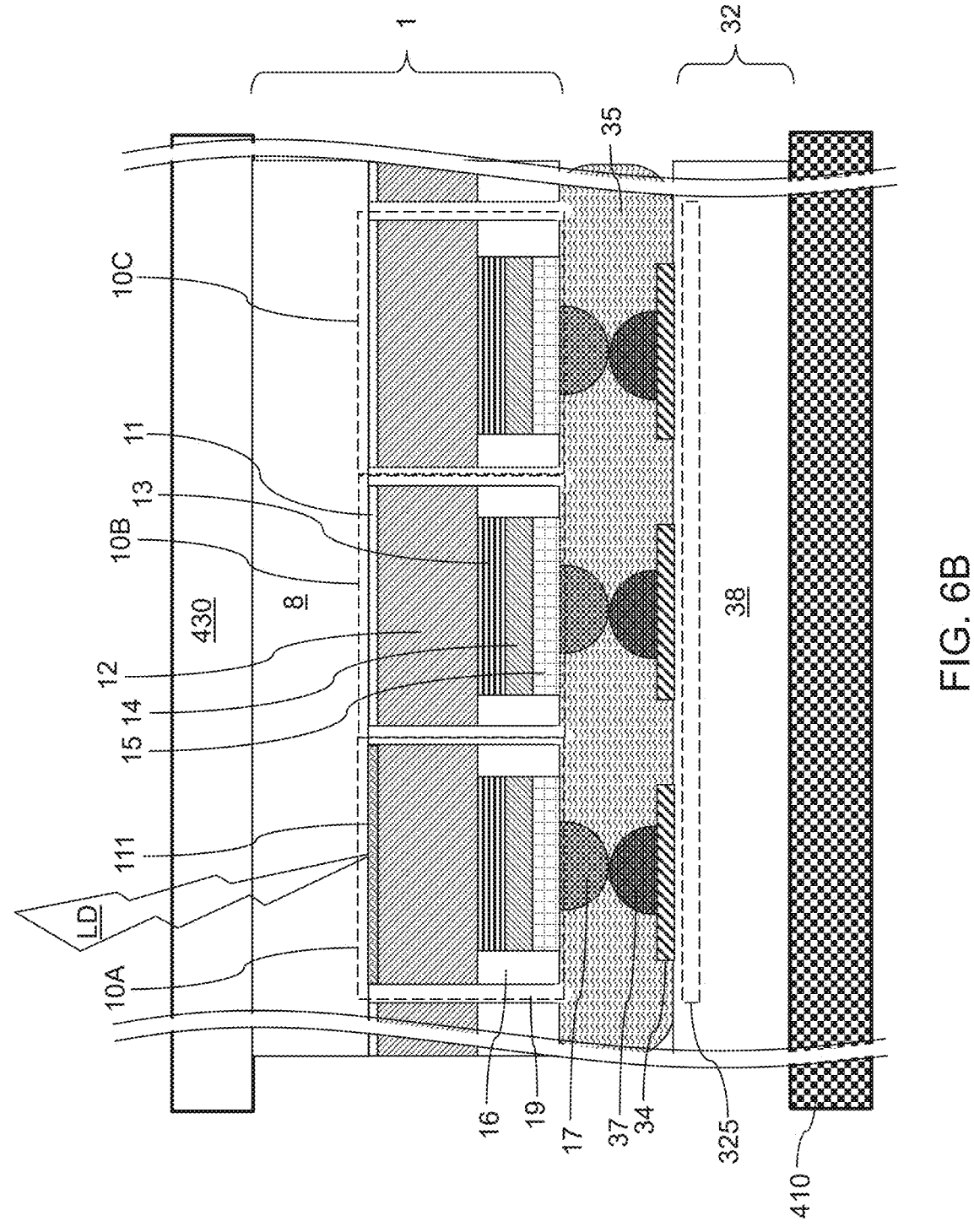
FIG. 6B illustrates a side a cross-sectional view of a sequential laser irradiation process performed to irradiate buffer layer 11 of the LED 10A that is to be transferred to the backplane 32 with a detachment laser beam LD, according to some embodiments.

Referring to FIG. 6B, a sequential laser irradiation process may be performed to irradiate buffer layer 11 of the LED 10A that is to be transferred to the backplane 32 with a detachment laser beam LD that is emitted from the laser radiation source 450. The detachment laser beam LD may perform a partial laser liftoff process used to partially lift off the LED 10A, and is herein referred to as a detachment laser irradiation process. Each buffer layer 11 of the LEDs 10A, 10B, 10C may be sequentially irradiated with the detachment laser beam LD one by one. The lateral dimension (such as a diameter) of the detachment laser beam LD can be about the same as the lateral dimension of the LEDs 10A, 10B, 10C. Thus, each buffer layer 11 can be individually irradiated without causing significant compositional changes in neighboring buffer layers 11.

The detachment laser beam LD can have an ultraviolet wavelength or a wavelength in a visible light range, and may be absorbed by the gallium and nitrogen containing III-V compound semiconductor material of the irradiated buffer layer 11. Without wishing to be bound by a particular theory, it is believed that irradiation of the detachment laser beam LD onto a buffer layer 11 evaporates nitrogen atoms without evaporating, or with minimal evaporation of, gallium atoms. The irradiation thus reduces the atomic percentage of nitrogen in a remaining material. The LED coupon 1 and the backplane 32 can be held in place by the pressure applied by the transparent panel 430 on the LED coupon 1 during and after this step.

In one embodiment, and without being bound by a particular theory, it is believed that the irradiated buffer layer 11 of LED 10A may be converted into gallium-rich drops 111. The gallium-rich drops 111 may consist of pure liquid gallium-rich drops or may include an alloy of gallium and nitrogen containing gallium at an atomic concentration greater than 55%, such as 60% to 99%.

Figure 6C:
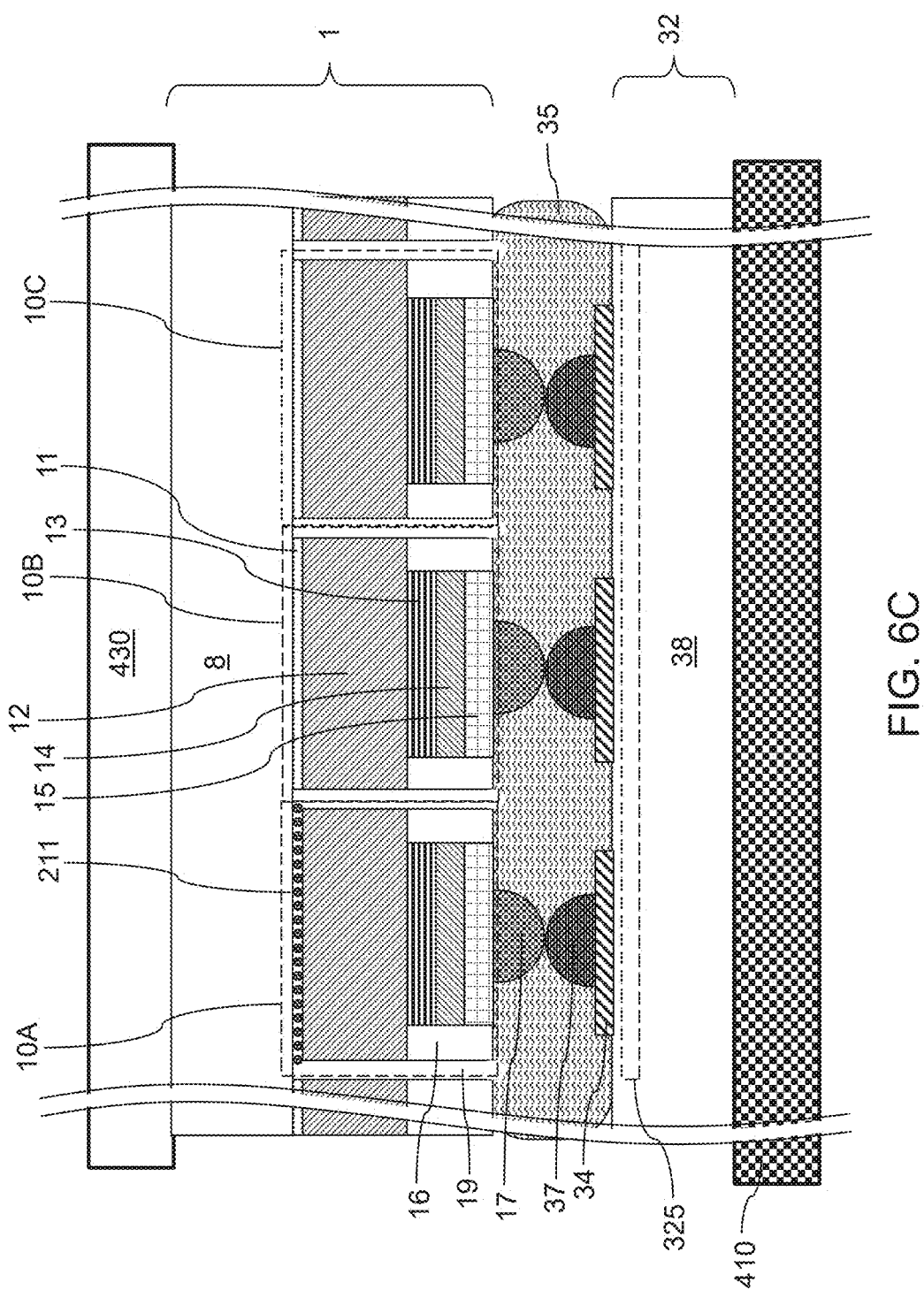
FIG. 6C illustrates a side a cross-sectional view of the liquid gallium-rich drops 111 solidifying into solid gallium-rich material portions (e.g., pure gallium or gallium rich alloy particles or regions) 211 after the irradiation, according to some embodiments.

As shown in FIG. 6C, the liquid gallium-rich drops 111 may solidify into solid gallium-rich material portions (e.g., pure gallium or gallium rich alloy particles or regions) 211 after the irradiation if the LED coupon 1 temperature is maintained below the melting temperature of gallium (e.g., 29.76° C.) or its alloy. In one embodiment, the gallium-rich material portions 211 can include gallium atoms at an atomic concentration greater than 55%, such as 60% to 100%. The gallium-rich material portions 211 can have an average thickness in a range from 5 nm to 100 nm, such as from 10 nm to 50 nm, although lesser and greater thicknesses can also be employed. The gallium-rich material portion 211 may comprise a continuous material layer, or may comprise a cluster of ball-shaped material portions. The buffer layers 11 of the LEDs 10B, 10C on the LED coupon 1 that are not irradiated with the laser beam LD remain as buffer layers 11, such as gallium nitride buffer layers having about 50 atomic percent gallium and thus having a higher melting point than the gallium-rich material portions 211.

Since a backplane-side bonding material portion 37 and a diode-side bonding material portion 17 within each adjoining pair merely contact each other during the laser irradiation and are not bonded to each other, the mechanical shock from the laser irradiation is not transmitted to the backplane 32 that can include a relatively fragile polymer. Thus, the partial laser liftoff described above with respect to FIGS. 6B and 6C which forms the gallium-rich material portions 211 may cause little or no damage to the backplane 32 and to the electrically conductive elements (34, 325) on the backplane 32. Further, the partial laser liftoff process prevents damage to re-solidified bonding material portions in subsequent processing steps because the bonding reflow happens after the partial laser liftoff.

Figure 6D:
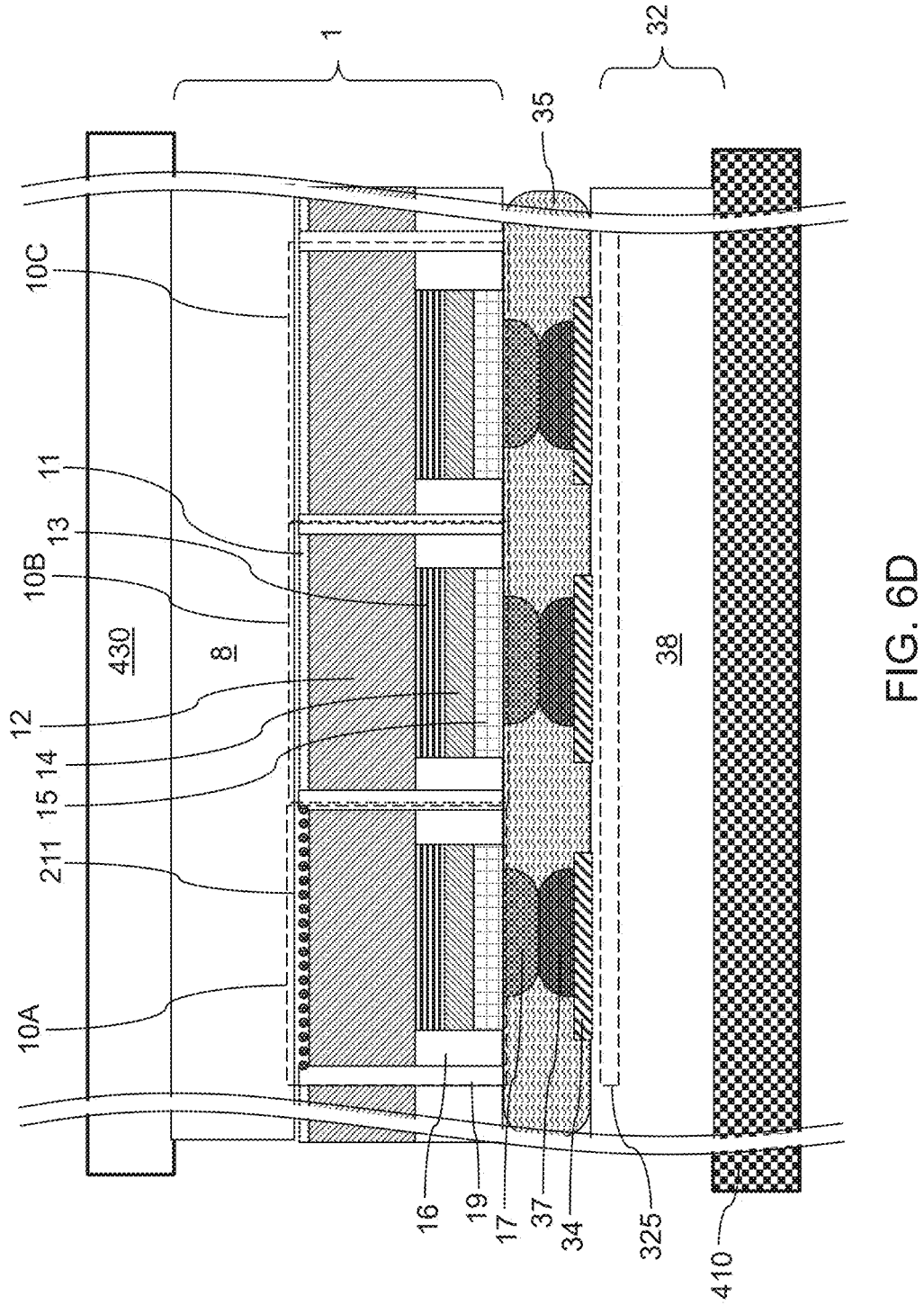
FIG. 6D illustrates a side a cross-sectional view of the backplane 32 and the LED coupon 1 pressed against each other to induce deformation of the bonding material portions (17, 37), according to some embodiments.

Referring to FIG. 6D, the backplane 32 and the LED coupon 1 can be pressed against each other with a greater force to induce deformation of the bonding material portions (17, 37) (i.e., to coin the bonding material portions to smooth out any rough bonding surfaces). Thus, each mating pair of a respective diode-side bonding material portion 17 and a respective backplane-side bonding material portion 37 can be pressed against each other at a second pressure that is greater than the first pressure after conversion of the buffer layer 11 of LED 10A into the gallium-rich material portion 211. As illustrated in FIG. 6D, the second pressure may be sufficient to cause deformation of the diode-side bonding material portions 17 and the backplane-side bonding material portions 37. In an illustrative example, if 100,000 pairs of a diode-side bonding material portion 17 and a backplane-side bonding material portion 37 are present between the backplane 32 and the LED coupon 1, then a magnitude of the pressure applied by the transparent panel 430 may be in a range from 500 N to 1,000 N.

Figure 6E:
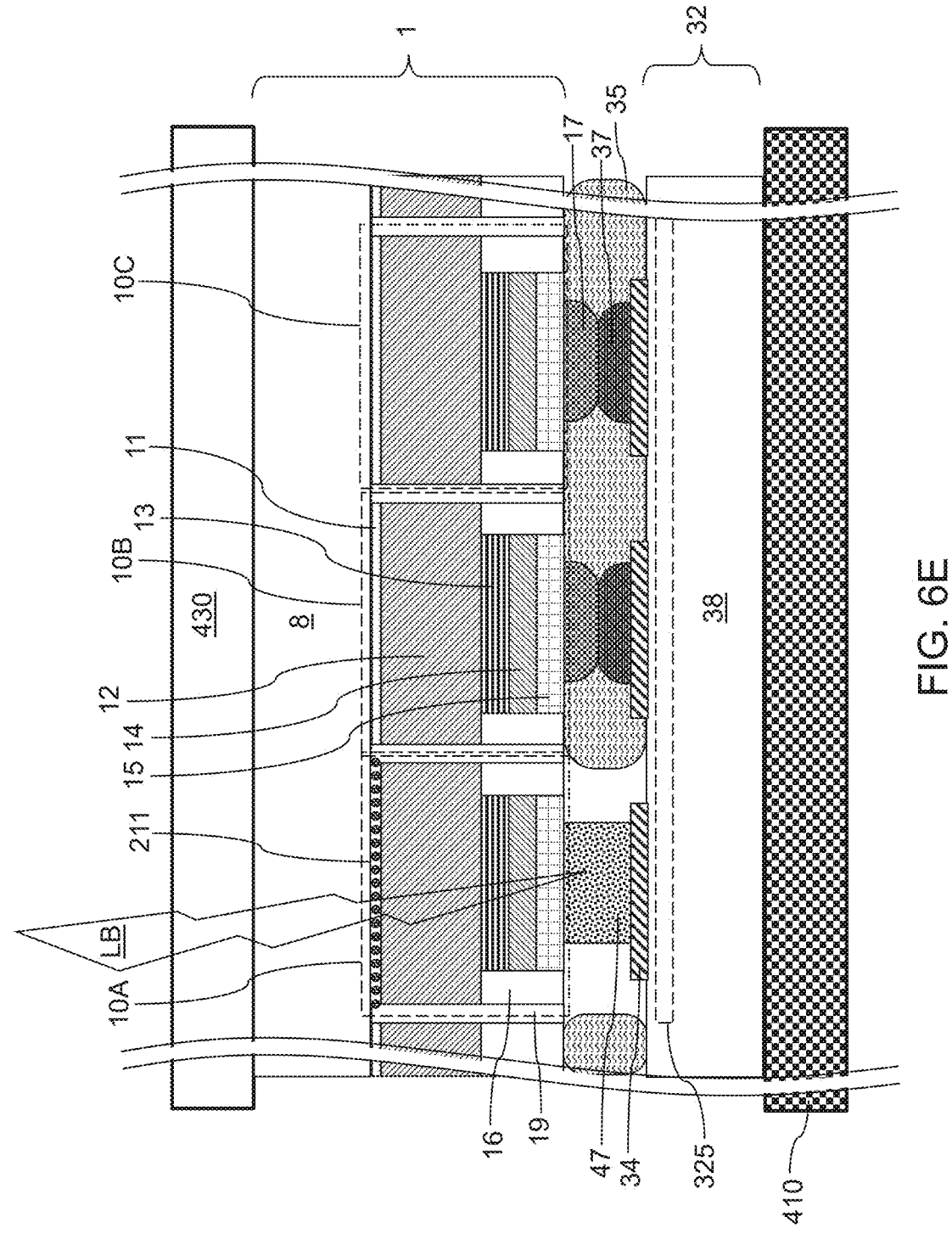
FIG. 6E illustrates a side a cross-sectional view of localized laser irradiation process performed to induce reflow and bonding of the mating pair of a diode-side bonding material portion 17 and a backplane-side bonding material portion 37 that underlies the LED 10A, according to some embodiments.

Referring to FIG. 6E, a localized laser irradiation process can be performed to induce reflow and bonding of the mating pair of a diode-side bonding material portion 17 and a backplane-side bonding material portion 37 that underlies the LED 10A. The laser irradiation induces bonding of the LED 10A to the backplane 32, and is herein referred to as a bonding laser irradiation process. The laser beam LB employed during the bonding laser irradiation process may have a photon energy that is less than the band gap of the III-V compound semiconductor materials (e.g., gallium and nitrogen containing materials) in the LED 10A and thus may pass through the LED 10A. For example, the laser beam LB employed during the bonding laser irradiation process may be an infrared laser beam such as a carbon dioxide laser beam having a wavelength of 9.4 microns or 10.6 microns.

The irradiated pair of a diode-side bonding material portion 17 and a backplane-side bonding material portion 37 connected to LED 10A may be heated to a reflow temperature at which the bonding materials (which may be solder materials) of the pair of the diode-side bonding material portion 17 and the backplane-side bonding material portion 37 reflow. Upon termination of the irradiation of the laser beam LB onto the mating pair of a diode-side bonding material portion 17 and a backplane-side bonding material portion 37, the reflowed material re-solidifies to provide a re-solidified bonding material portion 47. The re-solidified bonding material portion 47 is thus bonded to a bonding pad 34 and contact-level material layers 15 of the LED 10A.

Thus, the LED 10A can be bonded to a respective underlying one of the bonding pads 34 by localized laser irradiation onto a respective underlying set of at least one bonding material portion (17, 37), which are reflowed and re-solidify to form a re-solidified bonding material portion 47. During the localized laser irradiation for transferring LED 10A, the mating pair of the diode-side bonding material portions 17 and the backplane-side bonding material portions 37 for LEDs 10B, 10C can be pressed against each other at the second pressure. Thus, the LED 10A can be bonded to the backplane 32, and the LEDs 10B, 10C on the LED coupon 1 can remain not bonded to the backplane 32. The gallium-rich material portions 211 provide weak adhesion force between the growth substrate 8 and a first conductivity type semiconductor layer 12. Since the LED 10A is held in place by the gallium-rich material portions 211, a lower power laser beam LB may be used than in prior art bonding processes. This further reduces damage to the backplane 32. The solder flux 35 may be evaporated during irradiation with laser beam LB or may be poured out after this step.

Figure 6F:
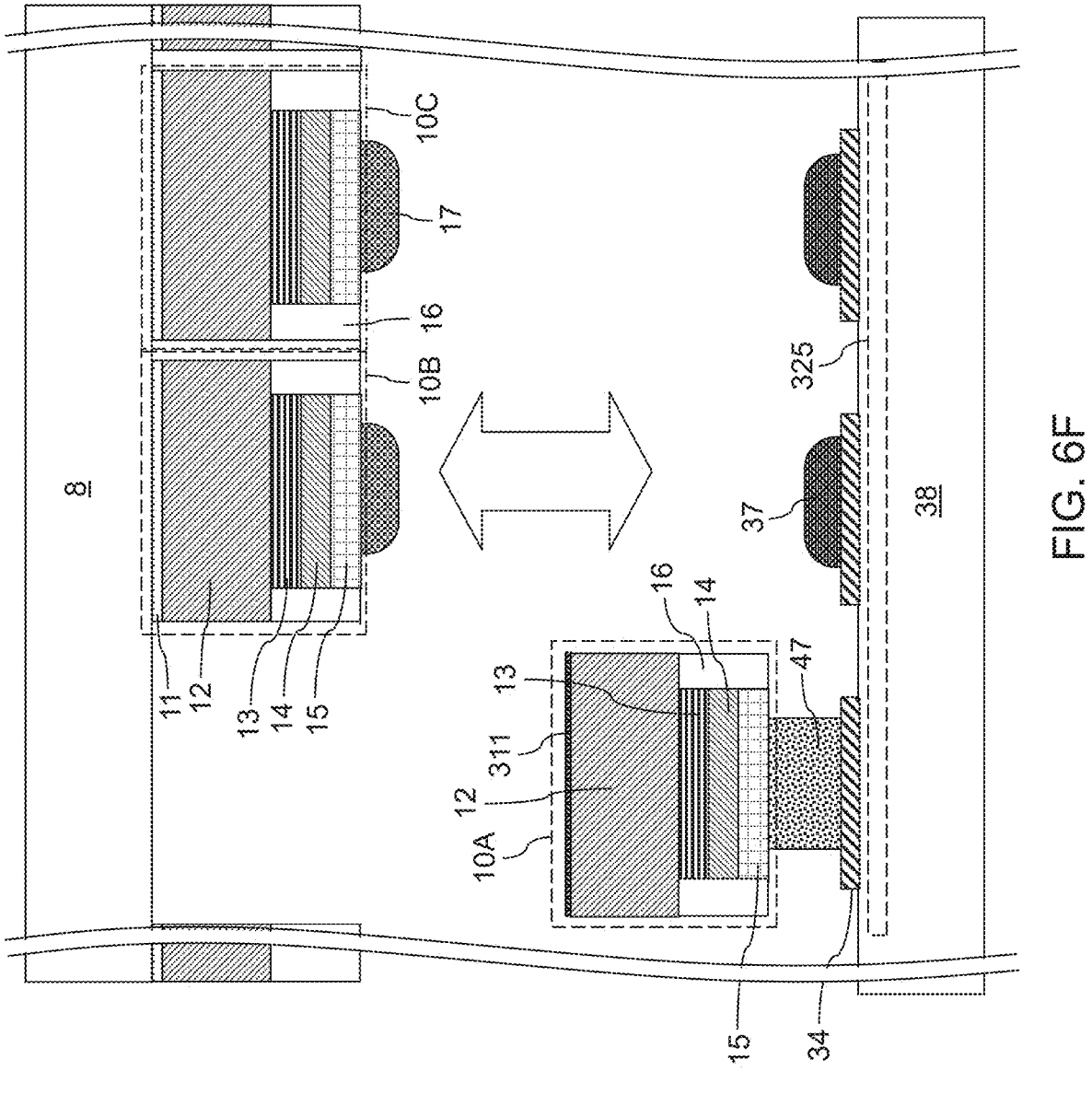
FIG. 6F illustrates a side a cross-sectional view of the vacuum source 440 ceasing to draw a vacuum on the space S between the backplane 32 and the LED coupon 1, so that the transparent panel 430 stops applying a downward pressure on the LED coupon 1, according to some embodiments.

Referring to FIG. 6F, the vacuum source 440 may cease to draw a vacuum on the space S between the backplane 32 and the LED coupon 1, so that the transparent panel 430 stops applying a downward pressure on the LED coupon 1. The backplane 32 may then be heated to a temperature above the melting temperature of the gallium-rich material portions 211 but below the melting temperature of the amorphous buffer layer 11 (e.g., below the melting temperature of gallium nitride). For example, if the gallium-rich material portions 211 comprise pure gallium, then the temperature may be raised to at least 30 degrees Celsius (e.g., 35 to 50 degrees Celsius) to melt to the gallium-rich material portions 211 into gallium-rich drops 111. This may allow the LED 10A to be separated from the growth substrate 8 with or without applying a mechanical force, while the LEDs 10B, 10C are unaffected and remain fixed to the growth substrate 8. Optionally, a gallium-rich material portion 311 (such as re-solidified gallium-rich drops 111 or remnants of portion 211) can be located on a surface of a first conductivity type semiconductor layer 12.

The same method may be sequentially used to transfer LEDs 10B and 10C to the backplane 32. Specifically, the vacuum is released and remaining portions of the LED coupons 1 containing first color LEDs 10A are removed from the apparatus 400 or 450 (i.e., moved away from the backplane 32 after the transparent panel 430 is lifted up) while the bonded LEDs 10A remain bonded to the backplane. Then different LED coupons 1 containing different color LEDs 10B are placed on the backplane 32. The vacuum is drawn again and the process steps of FIGS. 6A to 6F is repeated for LEDs 10B. The same steps are then repeated for LEDs 10C.

Figure 7:
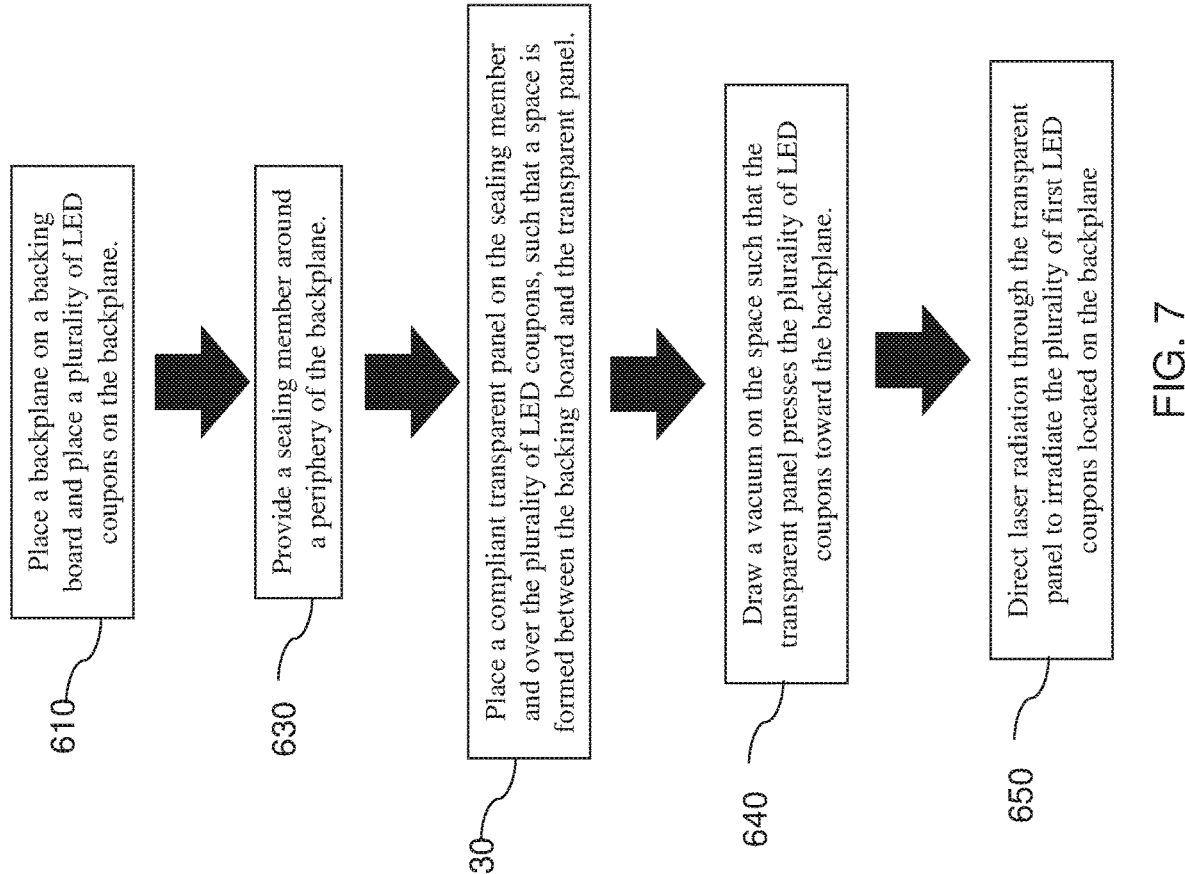
FIG. 7 illustrates a flowchart for a method of transferring LEDs, according to some embodiments.

FIG. 7 illustrates a flowchart for a method of transferring LEDs, according to some embodiments. As illustrated in FIG. 7, the method includes a Step 610 of placing a backplane on a backing board and placing a plurality of LED coupons on the backplane. The method also includes a Step 620 of providing a sealing member around a periphery of the backplane. The sealing member 420 may be permanently attached to the backing board or it may be placed into the apparatus before or after Step 610. The method also includes a Step 630 of placing a compliant transparent panel on the sealing member and over the plurality of LED coupons, such that a space is formed between the backing board and the transparent panel. The method also includes a Step 640 of drawing a vacuum on the space such that the transparent panel presses the plurality of LED coupons toward the backplane. The transparent panel bends toward the backplane to press the plurality of LED coupons toward the backplane after drawing the vacuum. The method also includes a Step 650 of directing laser radiation through the transparent panel to irradiate the plurality of first LED coupons located on the backplane.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. Where an embodiment employing a particular structure and/or configuration is illustrated in the present disclosure, it is understood that the present invention may be practiced with any other compatible structures and/or configurations that are functionally equivalent provided that such substitutions are not explicitly forbidden or otherwise known to be impossible to one of ordinary skill in the art.

What is claimed is:

1. A system comprising:
an apparatus for transferring light-emitting diodes (LEDs), the apparatus comprising:
a backing board configured to support a backplane;
a sealing member located on the backing board around a periphery of a position of the backplane;
a glass panel that is transparent, the glass panel located on the sealing member such that a space is formed between the backing board and the glass panel;
a vacuum source configured to draw a vacuum on the space; and
a laser radiation source that is configured to direct a laser radiation through the glass panel to irradiate a LED coupon on the backplane in the space,
wherein the vacuum source is configured to draw the vacuum on the space such that the vacuum pulls the glass panel toward the backplane, thereby causing the glass panel to press the LED coupon toward the backplane,
wherein an upper surface of the sealing member is configured to be above an upper surface of the backplane in a case where the backplane is supported by the backing board, and wherein the glass panel is on the upper surface of the sealing member.

2. The system of claim 1, further comprising:
the backplane located on the backing board; and
the LED coupon located on the backplane.

3. The system of claim 1, wherein the vacuum source is configured to draw the vacuum such as to cause the glass panel to press the LED coupon with a pressure that is substantially uniform over an entirety of the glass panel, and wherein the pressure is less than or equal to 14.7 psi.

4. The system of claim 1, further comprising:
the backplane located on the backing board; and
a plurality of LED coupons that are located in an array on the backplane,
wherein the glass panel is configured to press on the plurality of LED coupons with a pressure that is substantially uniform over the plurality of LED coupons.

5. The apparatus of claim 1, further comprising the LED coupon,
wherein the LED coupon comprises a micro-LED coupon comprising a substrate and a plurality of micro-LEDs that are formed on the substrate and are to be transferred from the substrate to the backplane.

6. The apparatus of claim 1, wherein the backing board comprises through channels, and the vacuum source is connected to the backing board and is configured to draw the vacuum on the space through the through channels.

7. The apparatus of claim 1, wherein the vacuum source further comprises a transparent vacuum bag that is formed around the backing board, the sealing member and the glass panel, and the vacuum source is configured to draw the vacuum on the space by drawing a vacuum on the transparent vacuum bag.

8. The apparatus of claim 1, wherein the glass panel has a thickness no greater than about 5 mm.

9. The apparatus of claim 8, wherein the backing board comprises a rigid backing board and the glass panel comprises a pliable transparent panel having a lower rigidity than a rigidity of the backing board.

10. The system of claim 1, further comprising the LED coupon,
wherein a thickness of the sealing member is equal or greater than 0.9 times and equal to or less than 1.1 times a combination of a thickness of the backplane and a thickness of the LED coupon.

* * * * *